United States Patent
Harkness, Jr. et al.

(10) Patent No.: US 10,993,331 B2
(45) Date of Patent: *Apr. 27, 2021

(54) HIGH-SPEED INTERCONNECTS FOR PRINTED CIRCUIT BOARDS

(71) Applicant: Amphenol Corporation, Wallingford, CT (US)

(72) Inventors: Arthur E. Harkness, Jr., Milford, NH (US); Eva M. Kenny-McDermott, Atkinson, NH (US); Paul W. Farineau, Amherst, NH (US); Raymond A. Lavallee, Londonderry, NH (US); Michael Fancher, Merrimack, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/031,748

(22) Filed: Jul. 10, 2018

(65) Prior Publication Data

US 2018/0332720 A1  Nov. 15, 2018

Related U.S. Application Data

(63) Continuation of application No. 14/970,479, filed on Dec. 15, 2015, now Pat. No. 10,051,746.

(Continued)

(51) Int. Cl.
*H05K 3/46* (2006.01)
*H05K 1/11* (2006.01)
(Continued)

(52) U.S. Cl.
CPC ......... *H05K 3/4632* (2013.01); *H05K 1/0242* (2013.01); *H05K 1/111* (2013.01);
(Continued)

(58) Field of Classification Search
USPC ........................................................ 174/258
See application file for complete search history.

(56) References Cited

U.S. PATENT DOCUMENTS 6,242,078 B1 * 6/2001 Pommer .............. H05K 1/0366
428/209
6,395,378 B2 * 5/2002 Bergstedt ............... H05K 3/387
174/250

(Continued)

FOREIGN PATENT DOCUMENTS

CN       1314072 A     9/2001
CN     101541142 A     9/2009
(Continued)

OTHER PUBLICATIONS

CN 201580073666.2, Dec. 24, 2018, Office Action.
(Continued)

*Primary Examiner* — Jinhee J Lee
*Assistant Examiner* — Krystal Robinson
(74) *Attorney, Agent, or Firm* — Wolf, Greenfield & Sacks, P.C.

(57) ABSTRACT

High-speed interconnects for printed circuit boards and methods for forming the high-speed interconnects are described. A high-speed interconnect may comprise a region of a conductive film having a reduced surface roughness and one or more regions that have been treated for improved bonding with an adjacent insulating layer. Regions of reduced roughness may be used to carry high data rate signals within PCBs. Regions treated for bonding may include a roughened surface, adhesion-promoting chemical treatment, and/or material deposited to improve wettability of the surface and/or adhesion to a cured insulator.

37 Claims, 8 Drawing Sheets

Related U.S. Application Data

(60) Provisional application No. 62/092,765, filed on Dec. 16, 2014.

(51) Int. Cl.

| | |
|---|---|
| *H05K 3/00* | (2006.01) |
| *H05K 3/22* | (2006.01) |
| *H05K 3/38* | (2006.01) |
| *H05K 1/02* | (2006.01) |
| *H05K 1/03* | (2006.01) |
| *H05K 1/09* | (2006.01) |
| *H05K 3/20* | (2006.01) |

(52) U.S. Cl.
CPC ............ *H05K 1/115* (2013.01); *H05K 1/116* (2013.01); *H05K 3/0073* (2013.01); *H05K 3/22* (2013.01); *H05K 3/38* (2013.01); *H05K 3/382* (2013.01); *H05K 3/388* (2013.01); *H05K 3/389* (2013.01); *H05K 3/4685* (2013.01); *H05K 1/034* (2013.01); *H05K 1/0326* (2013.01); *H05K 1/0346* (2013.01); *H05K 1/0366* (2013.01); *H05K 1/0373* (2013.01); *H05K 1/09* (2013.01); *H05K 3/202* (2013.01); *H05K 3/383* (2013.01); *H05K 3/384* (2013.01); *H05K 3/385* (2013.01); *H05K 3/4658* (2013.01); *H05K 2201/015* (2013.01); *H05K 2201/0145* (2013.01); *H05K 2201/0154* (2013.01); *H05K 2201/0158* (2013.01); *H05K 2201/0209* (2013.01); *H05K 2201/0212* (2013.01); *H05K 2203/1194* (2013.01)

(56) References Cited

U.S. PATENT DOCUMENTS

| | | | | |
|---|---|---|---|---|
| 6,596,384 B1* | 7/2003 | Day | ............ | H05K 1/0242 174/250 |
| 6,613,413 B1* | 9/2003 | Japp | ............ | H05K 3/38 174/255 |
| 6,631,838 B2* | 10/2003 | Kim | ............ | H05K 3/0094 174/250 |
| 6,698,648 B2* | 3/2004 | Wunderlich | ............ | H05K 3/243 216/18 |
| 6,700,069 B1* | 3/2004 | McDermott | ............ | H05K 3/381 174/255 |
| 6,960,831 B2* | 11/2005 | Burrell | ............ | H01L 24/05 257/751 |
| 7,060,364 B2* | 6/2006 | Kataoka | ............ | H05K 3/388 205/205 |
| 7,076,868 B2* | 7/2006 | Kaneda | ............ | H01L 23/49816 216/18 |
| 7,132,922 B2* | 11/2006 | Harris | ............ | H01C 17/06513 338/22 SD |
| 7,183,891 B2* | 2/2007 | Harris | ............ | H01C 7/12 338/204 |
| 7,202,770 B2* | 4/2007 | Harris | ............ | H01L 23/62 338/21 |
| 7,434,311 B2* | 10/2008 | Koizumi | ............ | H05K 3/427 174/262 |
| 7,438,969 B2* | 10/2008 | Kojima | ............ | H05K 3/0094 174/255 |
| 8,119,921 B1 | 2/2012 | Goergen et al. | | |
| 10,051,746 B2* | 8/2018 | Harkness, Jr. | ....... | H05K 3/4632 |
| 2002/0180004 A1 | 12/2002 | Oggioni et al. | | |
| 2004/0229024 A1 | 11/2004 | Harada et al. | | |
| 2006/0278963 A1 | 12/2006 | Harada et al. | | |
| 2008/0020546 A1 | 1/2008 | Cooney, III et al. | | |
| 2009/0092749 A1 | 4/2009 | Tachibana et al. | | |
| 2009/0272562 A1 | 11/2009 | Yoshioka et al. | | |
| 2012/0153463 A1 | 6/2012 | Maeda | | |
| 2013/0153271 A1 | 6/2013 | Ogawa et al. | | |

FOREIGN PATENT DOCUMENTS

| | | |
|---|---|---|
| CN | 101547559 A | 9/2009 |
| CN | 102573280 A | 7/2012 |
| JP | 5-291806 | 11/1993 |
| JP | 7-147352 | 6/1995 |
| JP | 11-121936 | 4/1999 |
| JP | 2003-209351 | 7/2003 |
| JP | 2005-286294 A | 10/2005 |
| JP | 2005-286300 | 10/2005 |
| JP | 2005-340382 | 12/2005 |
| JP | 2006-148079 | 6/2006 |
| JP | 2006-179537 | 7/2006 |
| JP | 2007-317900 | 12/2007 |
| JP | 2013-191894 | 9/2013 |
| KR | 1020090060958 A | 6/2009 |
| WO | WO 00/07219 A3 | 5/2000 |

OTHER PUBLICATIONS

Chinese Office Action for Chinese Application No. 201580073666.2 dated Dec. 24, 2018.
Japanese communication in connecion with Application No. JP 2017-532136 dated Dec. 3, 2019.
Chinese Office Action for Chinese Application No. 201580073666.2 dated Mar. 5, 2020.
JP 2017-532136, Dec. 3, 2019, Japanese communication.
CN 201580073666.2, Mar. 5, 2020, Chinese Office Action.
International Search Report and Written Opinion for International Application No. PCT/US2015/065912 dated May 4, 2016.
U.S. Appl. No. 14/970,479, filed Dec. 15, 2015, Harkness et al.
PCT/US2015/065912, May 4, 2016, International Search Report and Written Opinion.
Chinese Office Action for Chinese Application No. 201580073666.2 dated Aug. 27, 2019.
CN 201580073666.2, Aug. 27, 2019, Office Action.

* cited by examiner

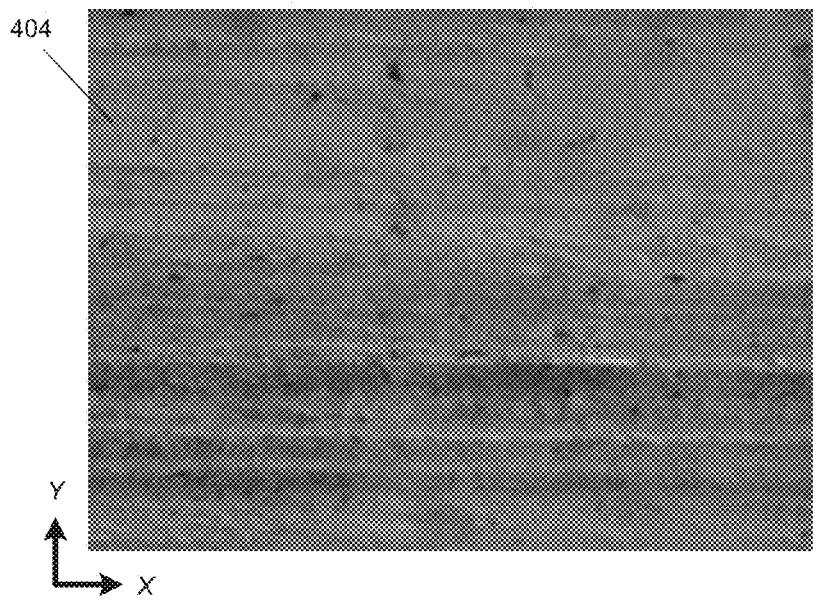
*FIG. 4B*
*FIG. 4C*
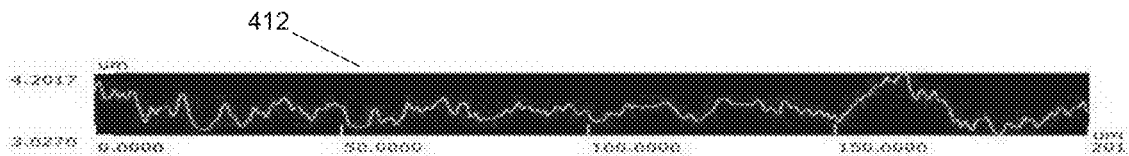
*FIG. 4D*
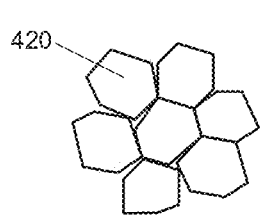 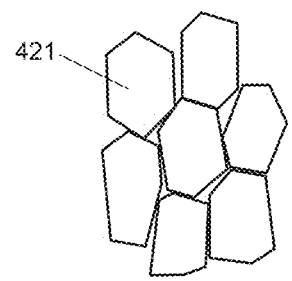
*FIG. 4E*          *FIG. 4F*

HIGH-SPEED INTERCONNECTS FOR PRINTED CIRCUIT BOARDS

CROSS-REFERENCE TO RELATED APPLICATIONS

This application is a continuation of U.S. application Ser. No. 14/970,479, titled "High-Speed Interconnects for Printed Circuit Boards," filed Dec. 15, 2015, which claims priority to U.S. provisional application Ser. No. 62/092,765, titled "High-Speed Interconnects for Printed Circuit Boards," filed Dec. 16, 2014, each of which is hereby incorporated by reference in its entirety.

FIELD OF THE INVENTION

The invention relates to forming high-speed interconnects for printed circuit boards. In some embodiments, the interconnects can support data rates greater than 50 Gb/s on PCBs.

BACKGROUND

Printed circuit boards (PCBs) are widely used in the electronics industry for the manufacture of electronic assemblies. PCBs may be assembled from stacks of dielectric layers (sometimes called "prepreg" layers prior to assembly) and/or laminates or cores. A laminate or core may include at least one planar electrically insulating layer and conductive foils or films on one or both surfaces of the insulating layer. Some of the conductive films may be patterned, using lithographic techniques, to form conductive interconnects that are used to make electrical connections within circuits formed on the PCB.

The dielectric layers, conductive films (patterned or unpatterned), and laminates may be formed into a multi-layer, integral "board" structure by pressing together a stack of layers and curing the prepreg layers. In some cases, there may be 10 or more interconnect levels in a multi-layer PCB. When fully assembled, the circuits may include a variety of circuit elements soldered to or otherwise attached to the PCB. The circuit elements may include, e.g., resistors, capacitors, inductors, transistors, fuses, integrated circuits (ICs) or chips, trim pots, electro-acoustic devices, microelectromechanical devices (MEMs), electro-optical devices, microprocessing chips, memory chips, multi-pin connectors, and various types of sensors, etc. Some of the conductive films may be left substantially intact and may act as ground or power "reference planes."

PCBs are routinely used in consumer electronics as well as custom applications. For example, PCBs may be used in smart phones to connect and enable data communication between processing electronics, signal transmitting and receiving electronics, and a display. PCBs may be used in laptops and personal computers for similar purposes. PCBs may be used in signal routers and data communication equipment. In such applications, large amounts of data and/or high-speed signals may be transmitted through interconnects of a PCB. Common insulating materials used in the manufacture of PCB dielectric layers support non-return-to-zero (NRZ) data transmission rates up to about 30 Gb/s. Because attenuation and speed of propagation of a signal along a trace depends on characteristics of the material surrounding that trace, more expensive, state-of-the art, high-performance insulating materials may be used to increase the transmission rates to nearly double that.

SUMMARY

The inventors have conceived of new approaches for forming high-speed conductive interconnects on PCBs that can allow higher data transmission rates through a PCB than would be supported on a PCB having a same dielectric layer structure and made by conventional PCB manufacturing processes. The inventive approaches described herein may be embodied, for example, as a printed circuit board, a method of forming a printed circuit board, a laminate for making a printed circuit board or a high speed electronic assembly.

According to some embodiments, a printed circuit board may comprise a first insulating layer, a second insulating layer, and at least one conductive interconnect. The conductive interconnect may include a first surface adjacent to the first insulating layer and a second surface opposite the first surface and adjacent to the second insulating layer. At least a first region of the first surface exhibits greater adhesion to the first insulating layer than a second region of the first surface. The first region may exhibit greater adhesion as a result of a bonding treatment selectively applied in that region. In some aspects, the first region may have a surface roughness, measured in any suitable manner, that is greater than a surface roughness, measured in a corresponding manner, of the second region. In some aspects, the first region may include a chemical adhesion promoter that is not present in the second region. In some aspects, the first region may include one or more materials formed over the conductive interconnect that improve mechanical and/or chemical adhesion of the first region to a resin component of the first insulating layer.

In some embodiments, a printed circuit board comprises an insulating layer, a plurality of interconnects formed from a rolled metallic film, such as a rolled annealed film, that are adjacent to the insulating layer, and reinforcing filling material located within the insulating layer that stiffens the printed circuit board. Reinforcing fillers alternatively or additionally may control the thickness of the insulating layer, such that more reinforcing fillers results in a thicker layer.

Also described is a laminate for manufacture of a printed circuit structure. The laminate may comprise an insulating layer, a rolled conductive film bonded to the insulating layer, and reinforcing filling material within the insulating layer.

According to some embodiments, a high-speed circuit for electronic devices may comprise a printed circuit board having conductive elements formed from a conductive film at a first level of the printed circuit board, a first insulating layer adjacent to first surfaces of the conductive elements, a second insulating layer adjacent to second surfaces of the conductive elements and opposite the first surfaces, and first treated surface regions distributed across the first surfaces of the conductive elements. The first treated surface regions may exhibit increased adhesion to the first insulating layer compared to untreated regions of the first surfaces.

Methods for making high-speed interconnects for printed circuit board applications are also described. According to some embodiments, a method of making a printed circuit board may comprise patterning, in a conductive film on a laminate, a plurality of conductive interconnects having a plurality of first surfaces, wherein the conductive film has an average peak-to-peak surface roughness less than 2 microns over the area of a conductive interconnect. A method may further include treating at least first portions of the first surfaces to increase adhesion of the first portions to an insulating layer of the printed circuit board. In some aspects, the treating may comprise roughening the surface of the conductive film at the first portions. In some aspects, the treating may comprise adding a chemical adhesion promoter to the surface of the conductive film at the first portions. In some aspects, the treating may comprise adding one or more materials to the surface of the conductive film at the first portions that improves mechanical or chemical adhesion of the first portions to a resin component of the insulating layer.

The foregoing is a non-limiting summary of the invention, which is defined by the appended claims. Other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

FIG. 4B is a scanning-electron micrograph of a surface of a rolled copper film that may be used to form high-speed interconnects in PCBs, according to some embodiments;

FIG. 4C represents a surface-roughness profile measured from an electrodeposited copper film, according to one embodiment;

FIG. 4D represents a surface-roughness profile measured from a rolled conductive film that may be used to form high-speed interconnects, according to some embodiments;

FIG. 4E depicts grain structures of copper foil;

FIG. 4F depicts grain structures of rolled copper foil;

Figure 1A:
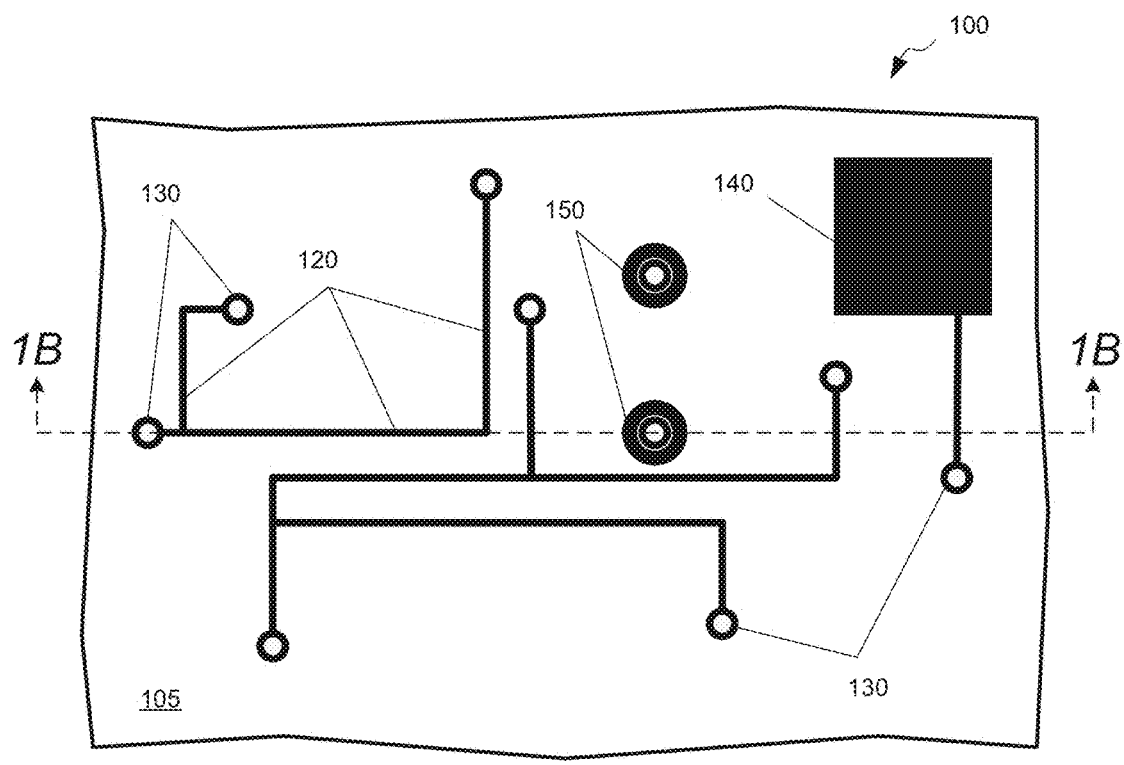
FIG. 1A depicts, in plan view, a portion of a patterned conductive film of a printed circuit board, according to some embodiments.

The features and advantages of the present invention will become more apparent from the detailed description set forth below when taken in conjunction with the drawings.

DETAILED DESCRIPTION

Recognizing a need for printed circuit boards that can support high-speed data rates, the inventors have conceived of high-speed conductive interconnects and methods for forming the interconnects on PCBs. The inventors recognized that some conductive films and films that have been subjected to conventional surface treatments to improve bonding of the conductive films have appreciable surface roughness that conventionally extends across all patterned interconnects and other features on a PCB. The inventors postulated that this roughness, at high data rates, can contribute undesirable scattering losses, and impede signal transmission. Accordingly, the inventors have developed processes to form high-speed PCB interconnects that have smooth surface regions on at least portions of the interconnects (such as circuit traces or ground planes adjacent traces), for improved signal transmission, and bonding-treated regions at pads and/or other features that improve adhesion to an insulating layer of the PCB. The inventors found that signal loss in dB through the high-speed interconnects can be reduced, in some embodiments, by as much as 20% as compared to a same PCB structure in which the interconnects included roughened surfaces on all sides. For example, a trace with 30 dB of attenuation made with conventional techniques with a 20% improvement may exhibit only 24 dB of loss, yielding a 4 times improvement in power transmission. The inventors also found that the high-speed interconnects could also support NRZ data rates above 40 Gb/s and up to 60 Gb/s for a PCB structure that would conventionally support NRZ data rates up to 30 Gb/s. In some cases, the high-speed interconnects support NRZ data rates greater than 60 Gb/s for a PCB structure that would conventionally support NRZ data rates up to 30 Gb/s.

Approaches for manufacturing printed circuit boards as described herein may be used to provide higher performance with relatively low-cost conventional materials or even higher performance when used with high-performance insulating materials. One approach comprises forming a PCB using a conductive film (in which conductive interconnects will be patterned) that has been smoothed on at least one side. For example, the film may be a smooth electrodeposited conductive film, a rolled conductive film, and optionally annealed, to produce smoothed surfaces. The film may comprise copper or any other suitable conductive material. In some embodiments, a conductive film may be polished (e.g., via chemical-mechanical polishing) to smooth a surface of the film. Portions of the film may be selectively treated for bonding to an insulating material that is used to form a PCB. A bonding treatment may entail, according to some embodiments, increasing the surface roughness of the treated portion of the film. In some implementations, a bonding treatment may entail chemically treating a surface of the conductive film with a chemical adhesion promoter that is compatible with a resin used to form a PCB. In some embodiments, a bonding treatment may entail depositing one or more thin films on the conductive film that adhere to the conductive film and to provide increased adhesion to a resin used to form a PCB. A bonding treatment may be used for one or both sides of a conductive film. The treatment may occur before and/or after patterning the film to create traces and other conductive structures within the PCB. In some embodiments, the smoothing and/or bonding treatment may be performed only on the film used to form traces for high speed signals or on the resulting traces, themselves. However, in other embodiments, the smoothing and/or bonding treatment may be performed on all conductive films or structures patterned from those films.

In some embodiments, one side of the film may be treated for bonding with an insulating material and the other side may be left in a smoothed state. The film may be bonded at its treated surface to insulating material, forming a laminate. The other surface may be subsequently treated for bonding as part of the laminate. The subsequent bonding treatment may be performed before or after the film is patterned to create conductive structures. For example, after patterning interconnects in the film, portions of the interconnects may be shielded from a subsequent bonding treatment that increases adhesion of the exposed surface of the film to an adjacent insulating layer. The inventors have found that smoothed surfaces on one side of interconnects can reduce signal loss and improve data transmission rates significantly in a fully-assembled PCB.

FIG. 1A depicts, in plan view, a core or laminate 100 of a printed circuit board that has been patterned to form conductive interconnects comprising electrical traces 120 (typically formed as lines of uniform width) and pads 130. The view in FIG. 1A corresponds to a lower surface of the laminate 100 in FIG. 1B. The pads are here shown as annular rings. This depiction represents "vias" that may be formed between layers of the printed circuit board. The vias may be formed by mechanically or laser drilling through all or a portion of the printed circuit board or any other suitable technique and plating the interior of the resulting hole with a conducting material. The insulating layer may have any suitable dimensions, such as a thickness that is less than 100 microns in some embodiments or less than 200 microns in other embodiments. When multiple laminates are stacked up to form a printed circuit board, pads attached to conductive interconnects on different layers that are to be electrically connected are aligned. A hole drilled through the board that passes through the aligned pads may be plated with metal, forming a conductive path between the interconnects on different layers of the printed circuit board. Accordingly, in this example, the pads are formed from pads attached to traces, as may be used in known processes for forming vias in printed circuit boards.

The interconnects may be formed on an electrically insulating or dielectric layer 105. In some cases, there may be pads 150 not connected to signal traces or ground planes 140 included in an interconnect level. The interconnects and other conductive features may be patterned from a conductive film of the laminate 100 using techniques known in the art (e.g., photolithography and etching). The conductive film may comprise any suitable conductive material (e.g., copper, aluminum, nickel, gold, silver, palladium, tin), and is typically deposited on or bonded to the dielectric layer 105. The interconnects may be used to route signals within an interconnect level, to route signals to other levels of an assembled PCB, to provide connections to one or more circuit elements that may be soldered to the board, and/or to connect to a power or ground reference.

As an example of patterning interconnects from a conductive film of a PCB, a positive (or negative) photoresist may be coated on the conductive film to form a layer of photoresist covering the conductive film. The layer of photoresist may be exposed to optical radiation through a contact mask containing a desired pattern (or inverse pattern) of traces 120, pads 130, pads 150, etc. For a positive resist, a mask pattern may appear as shown in FIG. 1A, for example. During optical exposure of the photoresist through the mask, regions of the resist that are not shielded by the pattern on the mask receive a dose of optical radiation. Alternatively or additionally, photoresist may be selectively exposed to optical radiation using a laser guided across the photoresist layer. The photoresist may then be developed and portions dissolved away, using a suitable resist developer, to reveal the desired pattern (or inverse). The removal of portions of the photoresist may expose regions of the conductive film, though the desired interconnects and features are protected by the remaining photoresist. The exposed conductive film may then be etched away using a suitable etchant or etching process. The remaining, un-etched areas of the conductive film yield the desired pattern of interconnects and features. Any remaining resist may be removed by a solvent or other known means.

Other techniques for patterning printed circuits may be used, and the above technique is just one example. In other embodiments, printed-circuit features (traces, pads, etc.) may be patterned in positive photoresist. After development of the resist, the printed-circuit elements may be plated, electrodeposited, or deposited in any suitable manner in the patterned resist. The resist, and any extraneous conductive material, may then be stripped from the laminate.

Figure 1B:
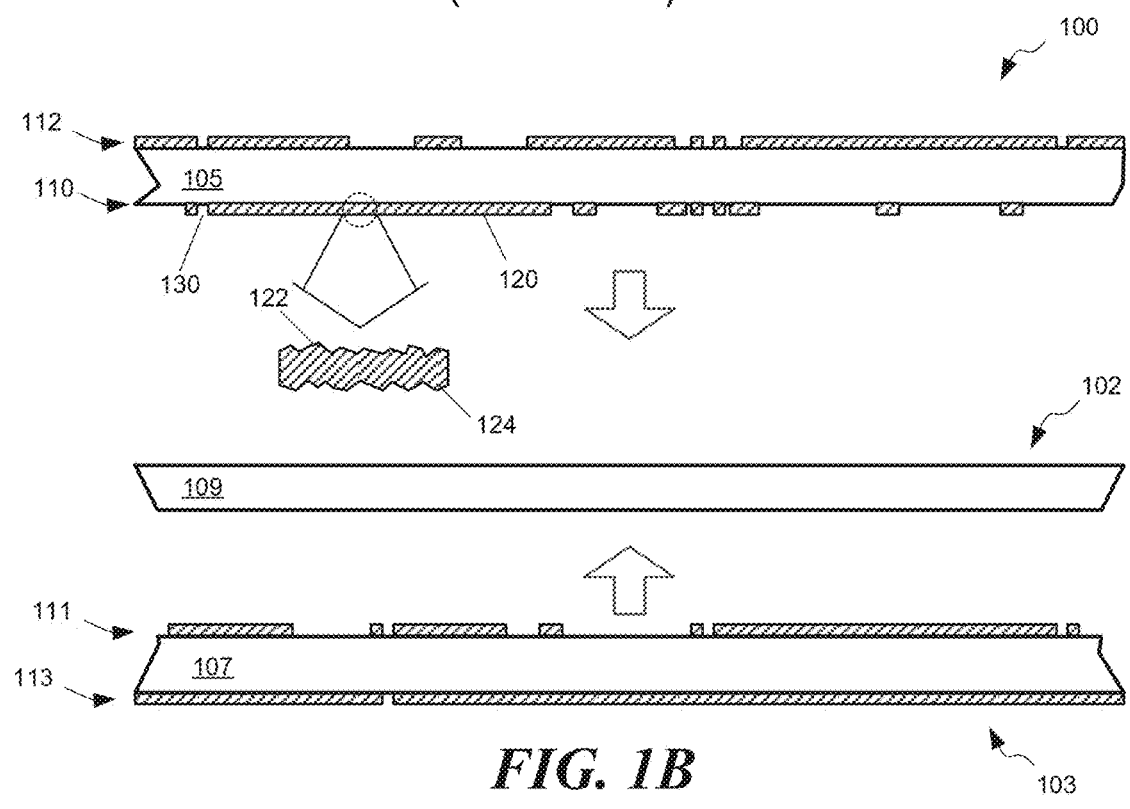
FIG. 1B depicts, in elevation view, layers of a multilayer PCB prior to bonding, according to some embodiments.

To form a multi-layer PCB 180 (depicted in FIG. 1C), additional dielectric layers and laminates may be bonded to the first laminate 100, as indicated in FIG. 1B. For example, an intervening layer 102 comprising a resin and/or uncured or partially cured insulating layer 109 (sometimes referred to as a "prepreg") may be bonded to a first surface of the laminate 100 and a surface of a second laminate 103, as depicted in the drawing. The second laminate 103, with an insulating layer 107 and conductive films 111 and 113, may be bonded to the first laminate 100 during a same bonding step.

Figure 1C:
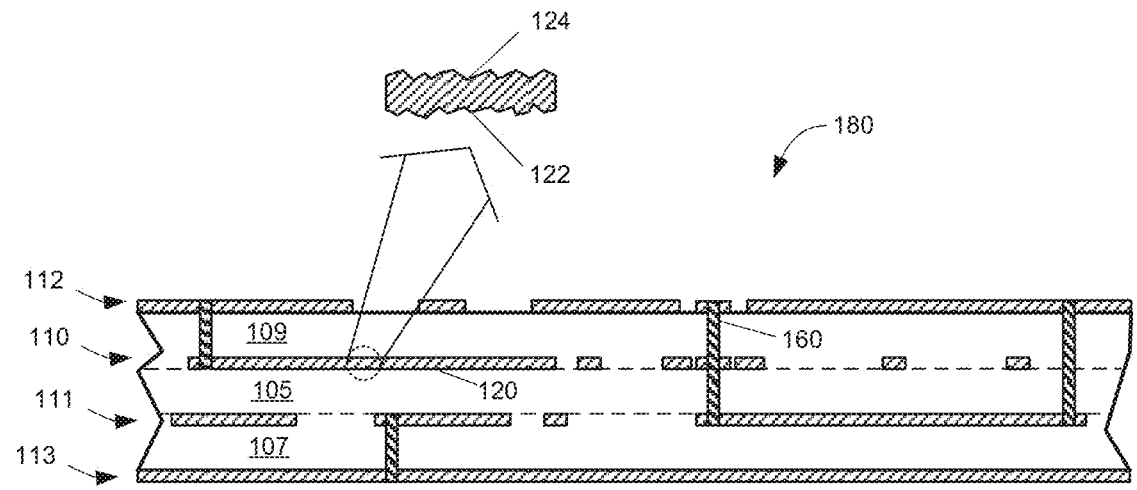
FIG. 1C depicts bonded layers of a multilayer PCB, according to some embodiments.

After bonding, conductive vias 160 may be formed to connect two or more interconnect levels, as depicted in FIG. 1C. For example, a via 160 may connect a first interconnect level 112 to a second interconnect level 111. FIG. 1C shows vias passing only partially through the printed circuit board. It should be appreciated that, in some embodiments, via holes may be drilled entirely through the printed circuit board rather than part-way through as may occur for blind holes, laser drilled holes, or holes formed between inner levels before outer levels of the PCB are added. In other embodiments, the holes may be plated along their length, but portions of the plating may be drilled away, leaving a conductive structure as shown in FIG. 1C that passes only part way through the printed circuit board. When portions of the plating are drilled away, a non-conductive hole (not shown) will pass through portions of the board. These techniques or any other suitable printed circuit board manufacturing techniques may be used.

FIG. 1B illustrates one approach for making a stackup of multiple layers of insulating material and conductive structures that may be pressed and bonded into a printed circuit board in accordance with known PCB manufacturing techniques. In this example, laminate 100 and laminate 103 have conducting structures on opposing surfaces. In some cases, a laminate may have a metal film that is patterned to form signal traces, pads, etc. on one surface, while the other surface has a conductive film that is predominately intact, except where vias pass through, to create a ground plane. Prepreg 102 does not contain conductive films, so that the resulting multilayer PCB has insulating layers between conductive layers. The insulating portions, whether of the laminate or prepreg, may be made of any suitable material, such as epoxy. For high-speed PCBs, the dielectric layers, whether in a laminate or prepreg, may comprise compositions containing polytetrafluoroethylene (PTFE) and/or a fluorinated ethylene propylene (FEP) resin. In some cases, there may be a mix of insulating layers, e.g., PTFE layers and prepreg or resin layers. Resin layers may comprise an epoxy, polyimide, Kapton, FEP, or liquid crystal polymer (LCP) resin. The insulating material may be filled with reinforcing fibers or other materials that lead to a rigid printed circuit board when the stackup is pressed together to form a printed circuit board.

It is known that the metal films may not adhere well to the insulating materials at temperatures and processes normally used during PCB manufacturing. To improve adhesion, exposed surfaces of interconnects and other conductive features patterned on an interconnect level may be rough. For example, the metal may be formed in a way that results in rough surfaces, such as through electrodeposition or an oxidation treatment of the metal surface. As a result, a circuit trace 120 may include roughened surfaces adjacent to each insulating layer 105, 109 when bonded in the PCB, as depicted schematically in the enlarged views of FIG. 1B and FIG. 1C. For example, a first surface 122 of a trace 120 that is in contact with a first dielectric layer 105 may have a first roughness, and a second surface 124 of the trace that is in contact with an adjacent dielectric layer 109 may have a second roughness. The first and second roughnesses may be approximately the same value, resulting from a roughening treatment or formation of the conductive film. As a result, surface roughness of conductive traces may be approximately uniform across the interconnect level 110, across ground planes, and/or large regions (e.g., regions greater than 1 cm$^2$) of an interconnect level.

The inventors postulated that the roughness of the first surface 122 and the second surface 124 of conventional traces 120 may increase scattering losses of high-speed signals traversing the signal traces and impede signal transmissions. Accordingly, the inventors have conceived of and developed techniques for forming conductive elements of PCBs with regions of reduced surface roughness and regions of improved bonding. According to some embodiments, the "smoothed" regions may be located over a majority of the surfaces of circuit traces 120 on an interconnect level, so that scattering losses and signal degradation is reduced for high-speed signals. The interconnect level may include other regions having treated surfaces that improve adhesion to an adjacent dielectric layer.

In some embodiments, the regions having treated surfaces may be distributed across an interconnect level. In some cases, the treated regions may be localized to pads 130. Alternatively or additionally, the treated surfaces may be selectively created on other features such as reference planes, etc. In some cases, reference planes may participate in the transmission of high-speed signals and may not be treated, or treated in regions remote from adjacent conductive traces. In accordance with some embodiments, the treated surface areas may be formed where they do not impact signal integrity of high speed signals or where they are most needed, such as adjacent conductors where high mechanical stress may be created by mismatch in coefficient of thermal expansion between the insulating and conductive materials used to form a printed circuit board. In some implementations, all surfaces of an interconnect level may be treated. According to some implementations, substantial portions of the traces and structures for carrying high speed signals may be smooth, but a sufficient amount of treated regions may be provided to ensure that the resulting printed circuit board has adequate mechanical integrity to resist delamination over a specified number of temperature cycles, even when subjected to moisture and other environmental conditions that can promote separation of the metal portions from the insulating portions of a printed circuit board.

A surface of a conductive element or film may be treated in different ways to improve bonding to an adjacent insulating layer. According to some embodiments, a bonding treatment may comprise roughening, or preserving a roughness of, a surface of the conductor. Roughening a surface of a smooth conductor may be accomplished with etching, oxidation, mechanical abrasion, or a combination thereof. In other embodiments, a bonding treatment may comprise chemically treating a surface of a conductor (e.g., with a silane-based chemical adhesion promotor) to increase adhesion between a metal conductor and an insulating layer such as a prepreg or resin. For example, MEC Flat BOND GT manufactured by Uyemura International Corporation may be used in a bonding treatment. In some embodiments, a bonding treatment may comprise adding additional inorganic and/or organic thin films to the surface of a conductor. The added film or films may provide adequate adhesion to the conductor, and additionally improve adhesion of the coated surface to a prepreg or resin. For example, a tin-oxide or other oxide or nitride coating may be applied to a copper conductor. In accordance with some embodiments described herein, conductive metal layers for a PCB may be applied as smooth layers and then treated for improved bonding using one or more of the above-summarized bonding-treatment techniques. In some implementations, a conductive metal layer may also be treated for improved bonding before it is bonded to an insulating layer and patterned.

Figure 2:
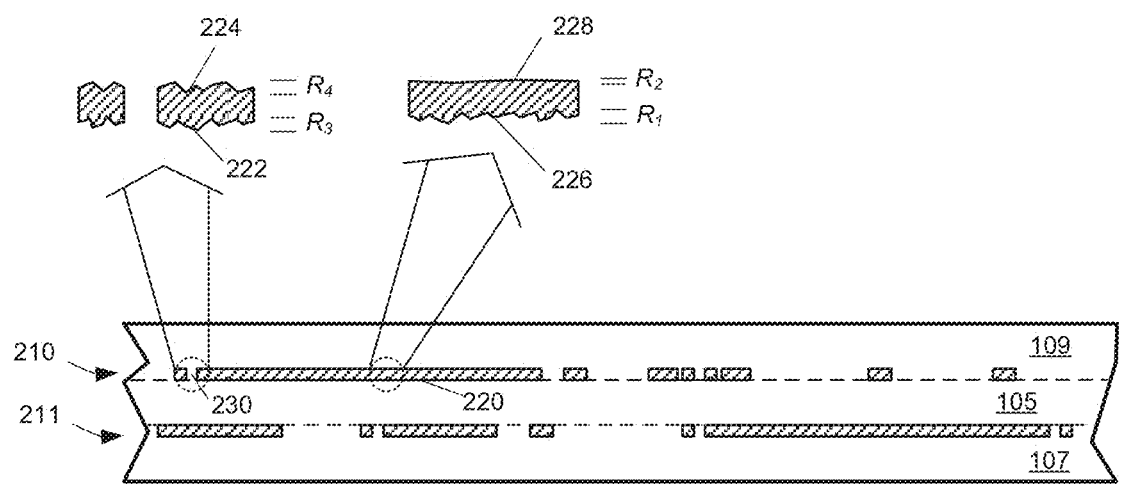
FIG. 2 depicts a section of a multilayer PCB incorporating high-speed interconnects, according to some embodiments.

Embodiments for a bonding treatment that utilizes surface roughening will now be described. A non-limiting example of a high-speed interconnect is depicted in FIG. 2. The drawing depicts two interconnect levels 210, 211 of a portion of a PCB. In this example, ground planes are not illustrated for simplicity, but may be present in some embodiments. FIG. 2 depicts separate laminate and prepreg layers that have been fused into a rigid printed circuit board. The boundaries between layers of dielectric material that was fused into the PCB structure are illustrated by dotted lines. In a physical structure, the boundaries between these layers may not be visible without magnification or other visual aid. However, in some embodiments, remnants of the boundaries between dielectric layers may remain in the structure in terms of discontinuities in measurable material properties. Alternatively or additionally, the boundaries between layers may be recognizable based on the location of conductive structures that were on the surfaces of individual layers before the stacked-up layers were fused into a printed circuit board. Thus, despite the solid nature of the fused laminate and prepreg, the resulting printed circuit board may nonetheless be described as having layers.

On a first interconnect level 210, an interconnect comprising a pad 230 and a trace 220 is formed. The pad may include a hole, which may be subsequently drilled through the insulating layers and plated to form conductive vias 160 (not shown in FIG. 2), according to some embodiments. At the pad, a first surface region 222 adjacent a first dielectric 105 and a second surface region 224 adjacent a second dielectric may be roughened. These surfaces may have surface-roughness values $R_3$ and $R_4$. The trace 220 may include a third surface region 226, which may have a roughness $R_1$ similar to the first and second surface regions. The trace may also include a fourth surface region 228 having a roughness $R_2$ that is less than the roughness $R_1$. The fourth surface region 228 may extend across a majority of the trace 220 (e.g., cover between 50% and 100% of the trace). In some implementations, there may be multiple distinct surface regions 228 covering a majority of the trace 220. In some embodiments, surfaces 222 and 226 may have a surface-roughness value approximately equal to that for surface 228 ($R_2$).

According to some embodiments, a roughness of a surface region may comprise a peak-to-peak value measured over the surface region. In some implementations, a roughness of a surface region may comprise an average peak-to-peak value measured over the surface region. In some implementations, a roughness of a surface region may comprise a root-mean-square value measured over the surface region. In some embodiments, a roughness $R_2$ of a smoothed surface region may be at least 25% less than a roughness $R_4$ of a roughened region. In some embodiments, a roughness $R_2$ of a smoothed surface region may be at least 50% less than a roughness $R_4$ of a roughened region. In some implementations, a roughness $R_2$ of a smoothed surface region may be between approximately 0.5 micron and approximately 1 micron (average peak-to-peak deviations), and a corresponding roughness $R_4$ of a roughened region may be between approximately 2 microns and 3 microns. An average peak-to-peak roughness may be determined by taking one or more linear profiles across a region (e.g., profilometer or AFM traces across a region).

Figure 3A:
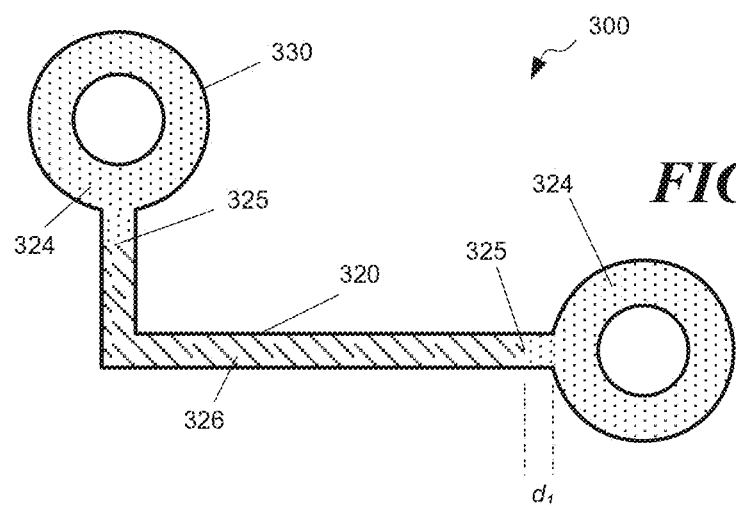
FIG. 3A through FIG. 3D depict various embodiments of high-speed interconnects.

FIG. 3A depicts, in plan view, just one embodiment of a high-speed interconnect 300 that may be formed in a PCB. Although only one interconnect is shown in the drawing, there may be tens, hundreds, thousands, or more interconnects formed on a PCB having a similar structure. The interconnect may be formed from a metallic film (e.g., smooth electrodeposited copper, rolled copper, rolled annealed copper, rolled aluminum, or rolled annealed aluminum). An interconnect may comprise one or more traces 320 and one or more connectors or pads 330. These structures may have any suitable lateral dimensions (in a direction perpendicular to the direction in which a trace 320 runs. Example dimensions include between 0.6 mm and 1.0 mm or between 0.25 mm and 1.0 mm at a pad 330 and between 25 and 75 microns or between 100 and 300 microns at a trace 320.

According to some embodiments, a first region 326 of a trace 320 may comprise at least one surface having a roughness $R_2$ that is less than a second region 324 of the interconnect 300. The second region 324 may be formed at a pad 330, for example. There may be 1 325 between the first region 326 and one or more second regions 324 on an interconnect 300. In some embodiments the boundaries may be located along a trace at a distance $d_1$ from a junction between the trace 320 and pad 330. The distance $d_1$ may be any value between 0 mm and 2 mm, according to some embodiments. The regions 324 having a roughened surface may be formed, for example, by an oxidation, mechanical abrasion, plating, or etching process, though any suitable surface treatment may be used to roughen the surface at these regions. In various embodiments, the smoothed region 326 of the trace 320 may be protected from the surface treatment (e.g., covered temporarily with a resist or protective layer), so that its surface is not roughened.

In some implementations, high-speed interconnects formed according to the present embodiments on a PCB having advanced dielectric materials (such as Megtron 6 and Megtron 7 dielectrics available from Panasonic PCB Materials of Santa Ana, Calif.) are capable of NRZ data transmission rates above 30 Gb/s. In some embodiments, high-speed interconnects formed according to the present embodiments on a PCB having other conventional dielectric materials are capable of NRZ data transmission rates above 30 Gb/s. In some embodiments, high-speed interconnects formed according to the present embodiments on a PCB having advanced dielectric materials are capable of NRZ data transmission rates above 40 Gb/s. In some embodiments, high-speed interconnects formed according to the present embodiments on a PCB having advanced dielectric materials are capable of NRZ data transmission rates up to 60 Gb/s. The signal loss upon transmission over the high-speed interconnects may be less than 25 dB over a length of approximately 70 cm.

Figure 3B:
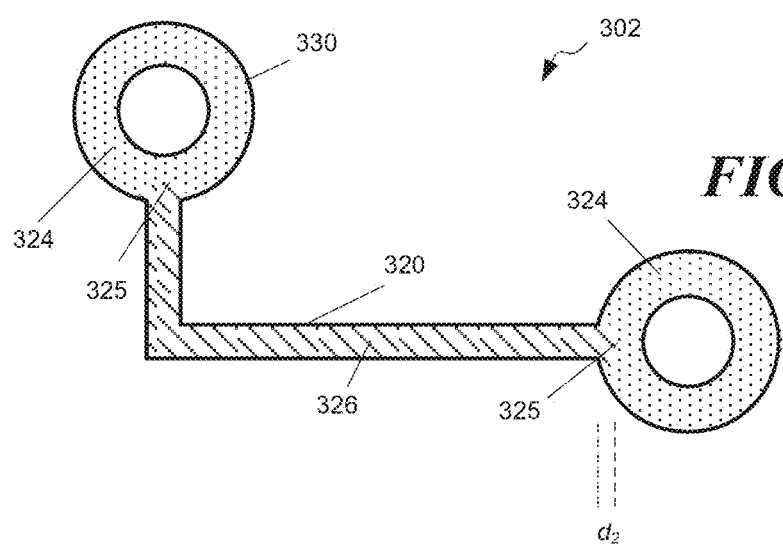

The arrangement of roughened regions 324 on an interconnect layer (e.g., interconnect layer 210 referring to FIG. 2) may be distributed in any suitable manner, and include arrangements other than shown in FIG. 3A. FIG. 3B depicts another embodiment of an interconnect 302 having a smoothed region 326 and roughened regions 324. According to some embodiments the roughened regions 324 may be formed at a portion of a pad 330. For example, a boundary 325 may lie or extend a distance $d_2$ within a region of the pad 330. The distance $d_2$ may be any value between 0 mm and 1 mm, according to some embodiments.

Figure 3C:
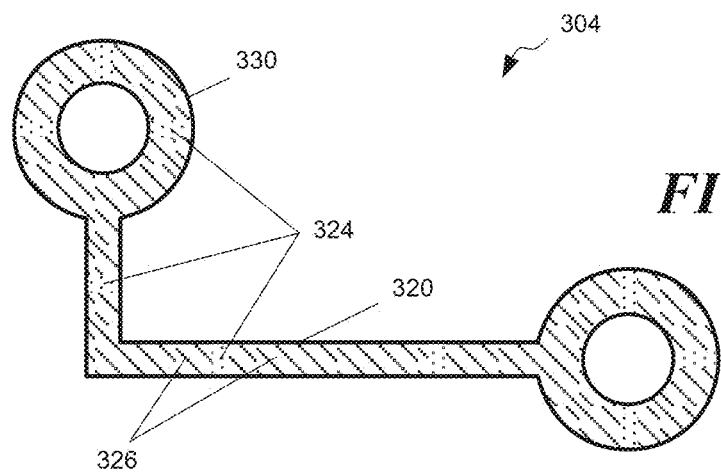

FIG. 3C depicts yet another embodiment in which roughened regions 324 may be distributed along an interconnect 304. In some embodiments, there may be one or more roughened regions 324 located at an interconnect 304 that are distributed over a majority of a first surface of the interconnect. There may be one or more roughened regions 324 separating smoothed regions 326 along a trace 320. Additionally or alternatively, there may be one or more roughened regions 324 separating smoothed regions 326 at a pad 330.

Figure 3D:
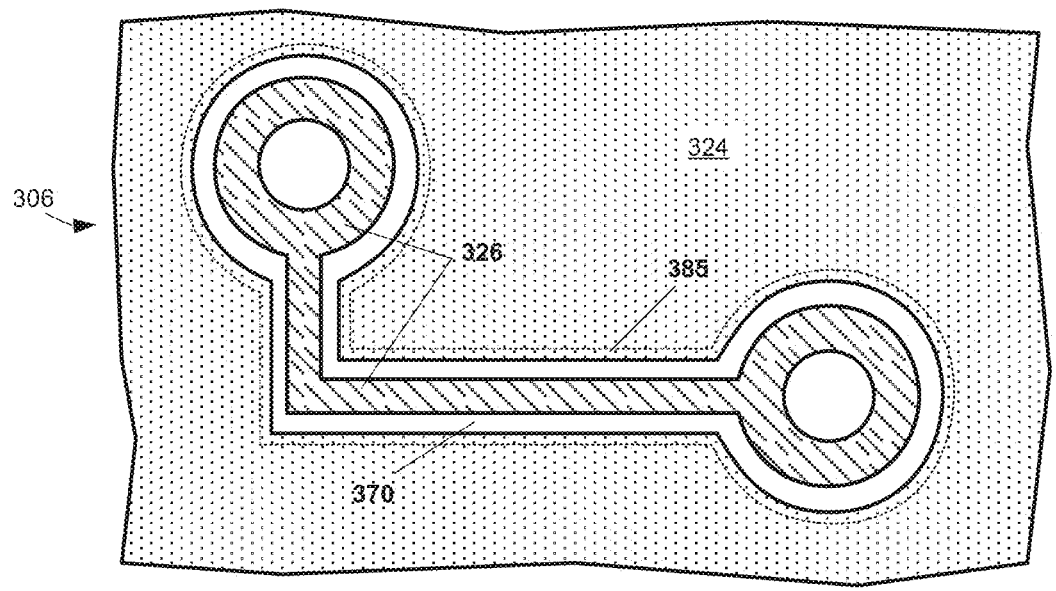

In some embodiments, an interconnect 306 may be patterned in a conductive film as depicted in FIG. 3D. The patterning of the interconnect 306 may comprise removing (e.g., etching away) a region of a conductive film around the interconnect. As a result, the interconnect 306 is insulated from the surrounding conductive film. According to some embodiments, an extended region 324 of the conductive film around the interconnect may be roughened. In some embodiments, region 324 may, or may not, be designed to carry high speed signals. It might, instead, be designed as a ground structure or reference plane. The interconnect 306 may be protected so that it is not roughened at any portion, and therefore comprise a first smoothed surface region 326. In some embodiments, an edge region 385 around the interconnect and extending into the surrounding conductive film between 0 mm and 2 mm may be smoothed.

According to some embodiments, roughened regions 324 of interconnects or other features on an interconnect level can provide adequate adhesion for joining multiple layers of a multilayer PCB, and preventing delamination of the PCB. The smoothed regions can reduce signal loss for signals traversing the circuit traces.

Figure 4A:
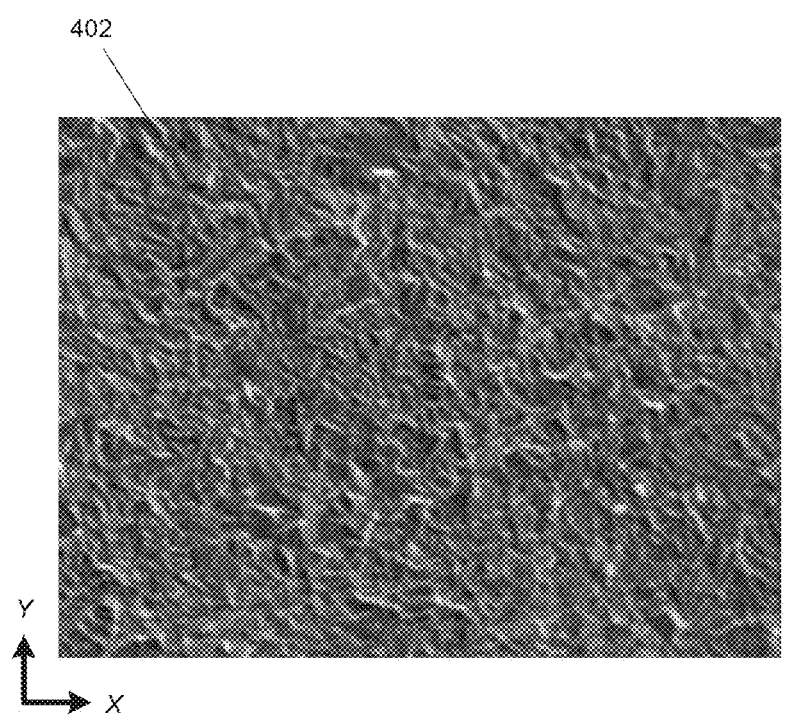
FIG. 4A is a scanning-electron micrograph of a surface of an electrodeposited copper film that may be used in a PCB, according to one embodiment.

Examples of roughened and smooth surface regions are depicted in FIG. 4A through FIG. 4D. FIG. 4A is a scanning electron micrograph of electrodeposited copper that is used in conventional PCB manufacture. The image was taken at a magnification of 5000 times. The SEM shows an exposed surface 402 of the copper and indicates a rough topography. This material may be used to form conventional interconnects on PCBs. The peak-to-peak surface roughness, averaged over 15 scans of the surface that were taken with an atomic force microscope, was found to be approximately 2 microns. The imaged surface is representative of interconnect surfaces that are conventionally used when bonding multiple layers of a PCB.

Similar or rougher surfaces to that shown in FIG. 4A may be obtained from surface treatments comprising oxidation, etching, plating, or mechanical abrasion of the conductive films. For an oxidized film, the averaged peak-to-peak surface roughness was measured using laser profilometry, and was found to be approximately 3 microns.

FIG. 4B depicts a scanning electron micrograph of a rolled copper foil (½-oz copper) that the inventors have used to form high-speed interconnects on PCBs. Such a foil may be formed, for example, by rolling a sheet of copper to a thickness of approximately 0.7 mils (about 18 microns). The image was also obtained at a magnification of 5000 times. The examined surface 404 shows a smoother topography (particularly in the direction of rolling) than the surface 402 of the electrodeposited copper shown in FIG. 4A. The rolled copper surface 404 shows some striations (running in the X direction) from the rolling process, which are visible in the lower portion of the image. The peak-to-peak surface roughness, averaged over 15 scans of the surface in the Y direction, was found to be approximately 1 micron.

FIG. 4C and FIG. 4D are sample surface-profiles that had been taken of the samples imaged in FIG. 4A in FIG. 4B, respectively. The profiles were taken with an atomic force microscope (AFM) over a larger distance (extending more than 200 microns) than imaged in FIG. 4A and FIG. 4B. The profile of FIG. 4C indicates a surface roughness (absolute peak-to-peak deviations) of approximately 2 microns for the single sample, and an average peak-to-peak roughness of approximately 1 micron. For the rolled copper sample of FIG. 4D, the profile shows a surface roughness (absolute peak-to-peak deviations) of just over 1 micron, and an average peak-to-peak roughness of approximately 0.4 micron. However, in FIG. 4D, the surface profile was taken in a direction transverse to the striations shown in FIG. 4B, a direction of highest surface roughness. A smoother profile is expected in a direction parallel to the striations for the sample depicted in FIG. 4B. Accordingly, in accordance with some embodiments, the average peak-to-peak surface variation of a smooth region may be half, or in some embodiments between about 20% and about 50% of the average peak-to-peak variation of a roughened region. The surface variation of a smooth region, for example, may be about half or less than about half for electrodeposited copper in accordance with IPC specification 4562. Conversely, the smoothed regions may be formed of rolled or rolled annealed copper in accordance with IPC specification 4562 and the roughened regions may be oxidized to have average peak-to-peak surface variations between two and five times the average peak-to-peak surface variations of the rolled or rolled annealed copper.

FIG. 4E and FIG. 4F illustrate the effect of a rolling process on grains of a conductive film. FIG. 4E depicts grains 420 of a conductive film before rolling. The grains may be arranged randomly in a tightly packed structure. The rolling process has been observed to elongate the grains in the direction of rolling, as depicted in FIG. 4F. The rolling can produce anisotropic grains 421 arranged in a preferred direction. The combination of smoothing the surface of the conductive film and elongating the grains by rolling may reduce loss for the conductive interconnects.

Structures associated with processes for forming high-speed interconnects are illustrated in FIG. 5A through FIG. 5E. According to some embodiments, a process for forming a high-speed interconnect may comprise obtaining a laminate 500 comprising a dielectric layer 520 and at least one conductive film 510 formed on the dielectric layer.

The dielectric layer 520 may comprise any suitable material that is used for printed circuit boards. In some embodiments, the dielectric layer may comprise a resin-system matrix that may, or may not, include fibrous reinforcing fillers or particulate fillers. Typical resin materials include epoxy, polyphenylene oxide, polyphenylene ether, cyanate ester, and hydrocarbon and may alternatively or additionally include other materials such as PTFE-based dielectric. The dielectric layer may be between 50 microns and 1 millimeter thick. In some embodiments, the dielectric layer 520 may comprise a thin layer (e.g., less than about 200 microns thick) of unreinforced polyimide, or any similar unreinforced film, which may be used for flexible PCBs. Alternatively, the dielectric layer may have reinforcing fillers, such as glass fibers, such that, when stacked up and pressed, the resulting structure will be a rigid printed circuit board. In some embodiments, the dielectric layer has a dielectric constant less than 4.0 and a dissipation factor less than 0.0035 at applied frequencies between 1 GHz and 12 GHz. In some implementations, the dielectric layer has a dielectric constant less than 3.5 and a dissipation factor less than 0.002 at applied frequencies between 2 GHz and 10 GHz.

The conductive film may comprise a rolled metallic film, according to some embodiments. For example, the conductive film may comprise rolled copper or rolled aluminum, though other rolled metallic films may be used. In some embodiments, the conductive film comprises rolled annealed copper or other rolled annealed metallic film. In some implementations, the conductive film may comprise an alloy including tin and/or zinc, or any other suitable metal.

Figure 5A:
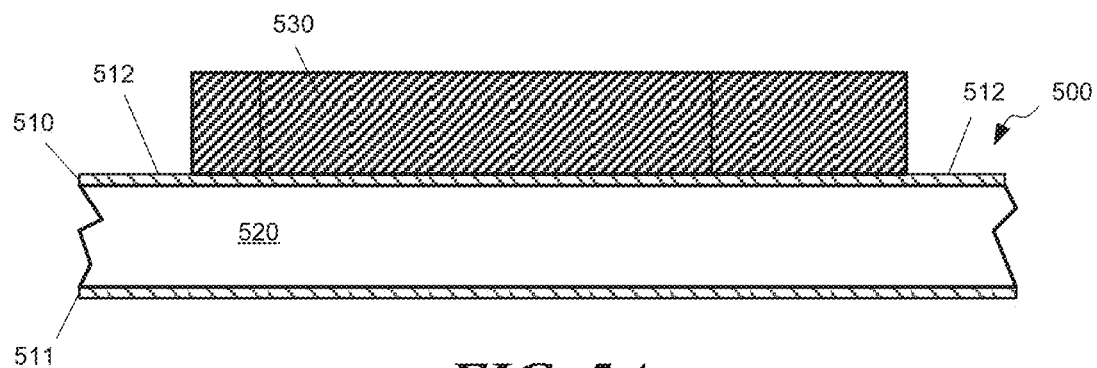
FIG. 5A through FIG. 5E depict structures associated with a method for forming high-speed interconnects on a PCB, according to just one embodiment.

A process for forming high-speed interconnects may further comprise covering the conductive film 510 with a layer of photoresist, and patterning the photoresist 530 in the shape of at least one interconnect, as depicted in FIG. 5A. Although only one feature is shown in FIG. 5A, hundreds, thousands, or even more features may be patterned in the photoresist 530 during a same patterning process across the laminate 500.

Figure 5B:
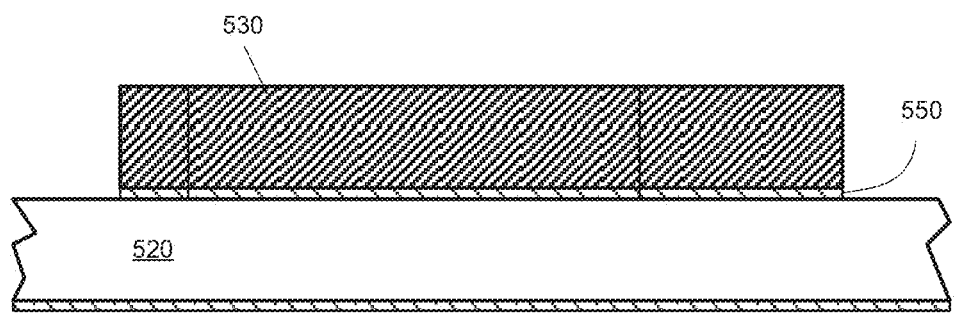
Figure 5C:
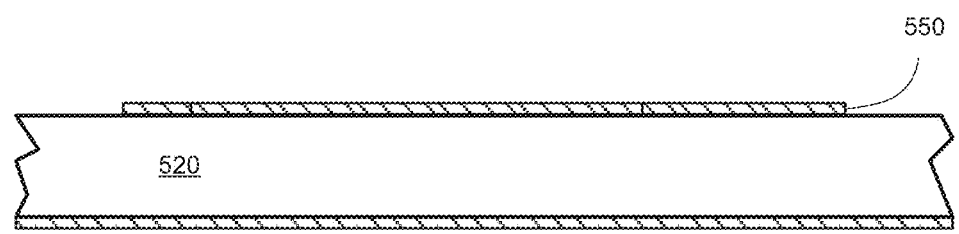
Figure 5D:
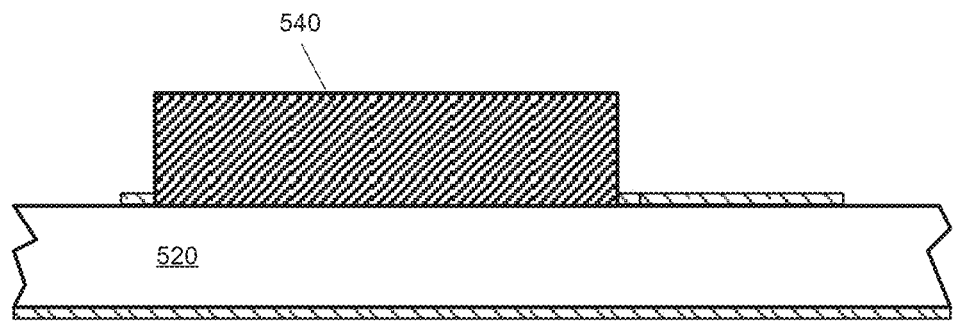
Figure 5E:
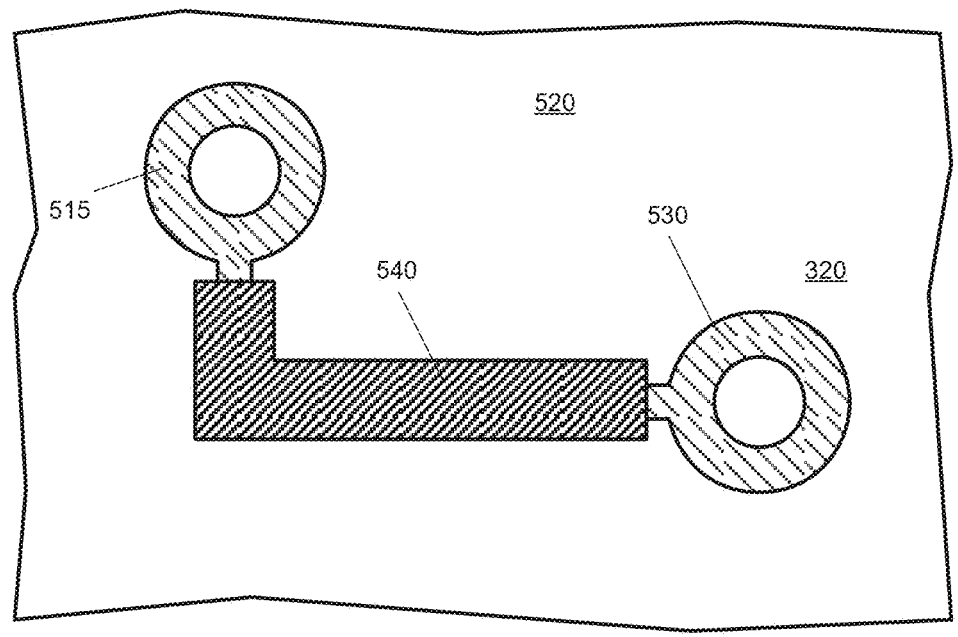

Exposed regions 512 of the conductive film 510 may then be subjected to an etching process, for example, a wet etch that removes the exposed regions of the conductive film. The resulting structure may appear as indicated in FIG. 5B. The photoresist 530 protects an underlying conductive interconnect 550, for example, from the etchant. The photoresist may then be stripped from the wafer, resulting in a structure depicted in FIG. 5C.

According to some embodiments, a second patterning process may then be carried out to cover one or more portions of the patterned interconnect 550. For example, a second photoresist layer may be applied to the laminate and patterned to produce the mask 540, as depicted in the elevation view of FIG. 5D and in the plan view of FIG. 5E. However, it should be appreciated that the mask covering a portion of an interconnect and exposing selective portions of the interconnect may be formed in any suitable way, including removing a portion of the photoresist 530. In some implementations, the mask 540 may be formed from any suitable protective material (e.g., a suitable polymer used as a solder mask) using other processes, and may not be formed from photoresist. For example, a polymer may be sprayed onto the PCB through a stencil mask. In some embodiments, the mask 540 may comprise a solder mask formed over portions of interconnects, and may not be removed after a bonding treatment of the exposed regions. Alternatively, selected regions of a layer of protective material may be ablated by a scanning laser beam to form exposed regions 512. Other patterning processes include, but are not limited to, silkscreen printing, direct write, and ink-jet printing.

In a bonding-treatment embodiment where etching, plating, deposition, mechanical abrasion, or optical ablation is used to form a roughened region, a protective mask 540 may cover a trace portion of the interconnect. For example, the protective mask 540 may cover a majority of a region of an interconnect that carries a transmitted signal between two pads 530. The covered region may be a continuous region, or may comprise discontinuous covered sections. In some embodiments, the mask 540 may leave at least a portion of the pads 530 exposed, and may leave a small portion, or portions, of a trace exposed. A subsequent bonding-treatment process may then roughen the surfaces of the exposed regions 515 of the interconnect, but not affect regions of the interconnect protected by the mask. One example of a bonding treatment is an Alphaprep® process available from Enthone, Inc. of Trumbull, Conn. This process may convert exposed surfaces of copper to a porous copper oxide. According to some embodiments, an etching process may be selected that preferentially etches into grain boundaries of the conductive film. For example, an etchant comprising ethanol or distilled water, hydrochloric acid, and ferric acid may etch preferentially along grain boundaries. Other etchants may be used to increase surface roughness. Subsequently the mask 540 may be stripped from the laminate to yield a high-speed interconnect structure as depicted in FIG. 3A, for example. The laminate 500 may subsequently be bonded to a prepreg layer or other insulating layer that is adjacent to the patterned and treated conductive film 510 when forming a stackup for a printed circuit board. The roughened regions 515 can improve adhesion to the prepreg.

When using an optical ablation process to roughen surface regions of conductive films, a second mask 540 may not be needed. For example, a laser-patterning tool may be used to scan over and draw patterned areas on a conductive film 510, as though patterning a photoresist. Exposure by the scanning laser may overheat and roughen the surface of a thin conductive film or may form a pattern of pockmarks from pulsing the laser to ablate small areas of the conductive film.

Figure 6A:
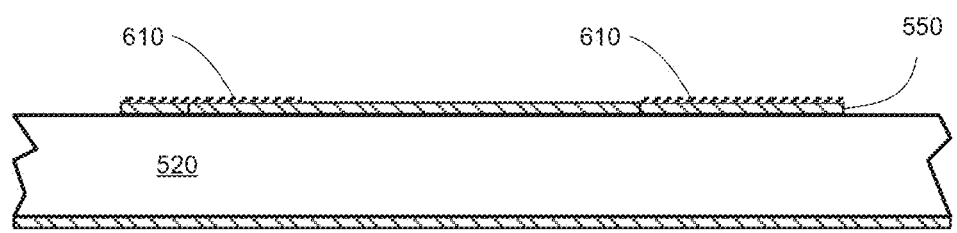
FIG. 6A depicts an interconnect of a PCB having regions treated with a chemical adhesion promoter.

Alternatively or additionally, other bonding-treatment techniques may be used to improve adhesion of regions of a conductive film to an insulating layer, and to reduce the likelihood of delamination of a PCB. According to some embodiments, after a second mask 540, or solder mask, has been formed, exposed conductive surfaces may be immersed in or rinsed with a chemical bath that includes an adhesion promoter that adheres to the conductive surface and chemically bonds with or adheres to a prepreg material or insulative layer. After an immersion or rinse in the bath, a resist mask 540 may be removed. As a result, portions of an interconnect may be coated with an adhesion promoter 610, as depicted in FIG. 6A.

In some implementations, an adhesion promotor may be applied to an entire conductive film (before or after patterning). For example, adhesion promotors that do not appreciably affect signal transmission through smooth conductive traces may be applied everywhere over patterned features. In such implementations, a second mask 540 may not be needed.

Figure 6B:
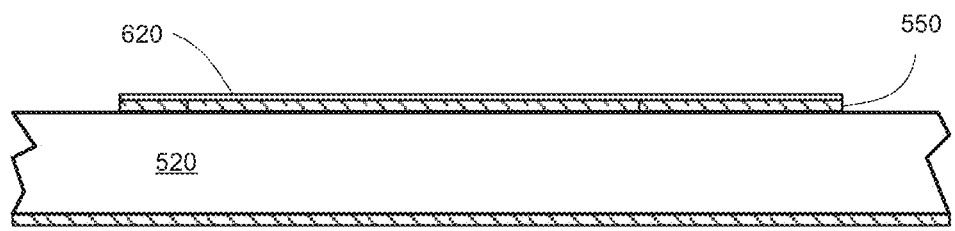
FIG. 6B depicts an interconnect of a PCB treated with at least one layer of material than improves wettability of the interconnect for an uncured form of an adjacent insulating layer.

In some embodiments, a bonding treatment may comprise depositing one or more materials (e.g., an oxide or nitride) on regions of a smooth conductor, or over an entire conductive film of a laminate (before or after patenting interconnects and other features in the film). The deposited material or materials may improve wettability of the surface for a resin or prepreg material. In some embodiments, a deposited material may form a chemical bond with a conductive film of the laminate. For example, and metal oxide 620 (e.g., zinc oxide or tin oxide) may be deposited over an interconnect, or portions of an interconnect. The oxide may increase wettability of the resulting surface, and one or more components of the oxide may bind with copper in the interconnect (e.g., to form a copper oxide or tertiary oxide). In some implementations, the deposited material may comprise two or more layers (e.g., a first metal layer that bonds with the conductive interconnect and a subsequently deposited oxide layer). The resulting structure may appear as indicated in FIG. 6B.

If materials to improve wettability are deposited before patterning a conductive film, a subsequent lithography process may be carried out to remove at least the oxide from pads 530. The subsequent lithography process may comprise forming a second mask 540 and performing a liquid etch to remove any oxide from exposed regions not protected by the mask 540.

Figure 6C:
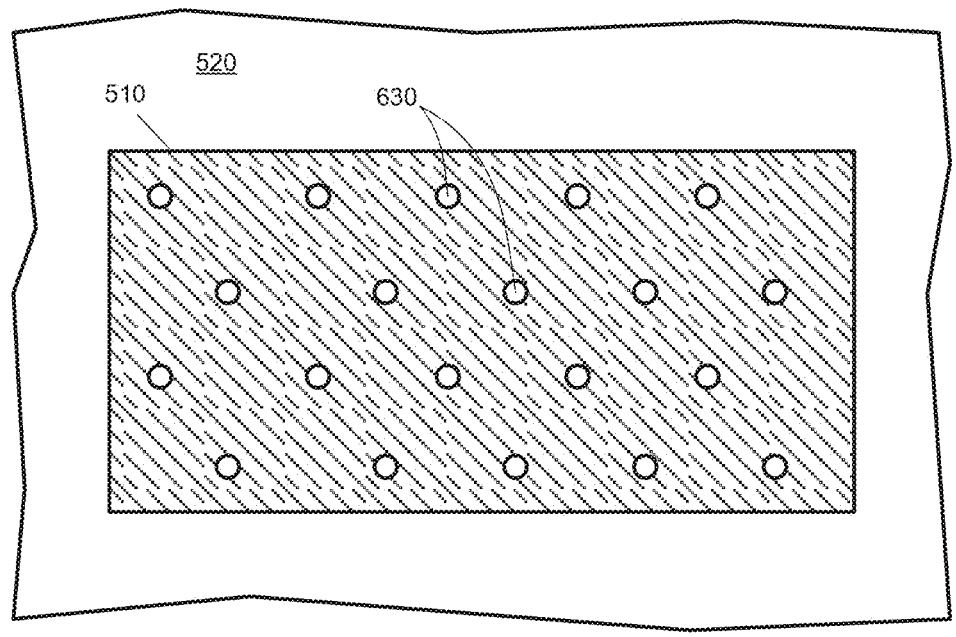
FIG. 6C depicts a bonding treatment for a region of a conductive film to improve adhesion between multiple layers of a PCB.

FIG. 6C depicts an additional embodiment of bonding treatment that may be used instead of or in addition to other bonding treatments described herein. In the foregoing examples, the conductive structures that were made smoother than in a conventional printed circuit board acted as signal traces. However, performance improvement may be achieved by using smooth surfaces on other conductors, including ground planes. The inventors theorize that, because high frequency signals may propagate through a printed circuit board as energy concentrated between a signal trace and a ground plane, a smoother surface on either the signal trace or ground plane or both will increase performance.

To resist delamination or other structural problems from using smooth materials (such as rolled copper) to make ground planes, bonding treatments may be selectively applied. As with signal traces, bonding treatments may be applied at or near pads or otherwise near holes that form interconnects between layers of a printed circuit board. Alternatively or additionally, bonding treatments may be selectively applied around the perimeter of a printed circuit board or distributed in a pattern across the ground plane.

Alternatively or additionally, other techniques may be used to promote mechanical integrity of the resulting printed circuit board with smooth material is used for ground planes. According to some implementations, one or more holes 630 may be formed in a smooth conductive film (which may be patterned or unpatterned). The holes may be formed by mechanical or laser drilling, etching, or any other suitable process. The holes may be microscale in size, e.g., having diameters between approximately 5 microns and approximately 50 microns. The holes may be distributed on a regular pattern across a conductive film, a random pattern, or may be formed at selected locations. In some embodiments, the holes 630 may be formed in reference planes and/or pads 530. The holes may improve adhesion of layers by allowing resin and/or prepreg material to pass through the conductive film and form a bond directly with an adjacent insulating layer. After curing the resin and/or prepreg materials, pillars of insulating material are formed that extend from one insulating layer, through an intervening conductive film, and to an adjacent insulating layer. Forming holes through a smooth conductive structure, such as a ground plane in a printed circuit board, may reduce attenuation of signals propagating through adjacent signal traces, while ensuring the mechanical integrity of the resulting printed circuit board.

Figure 7:
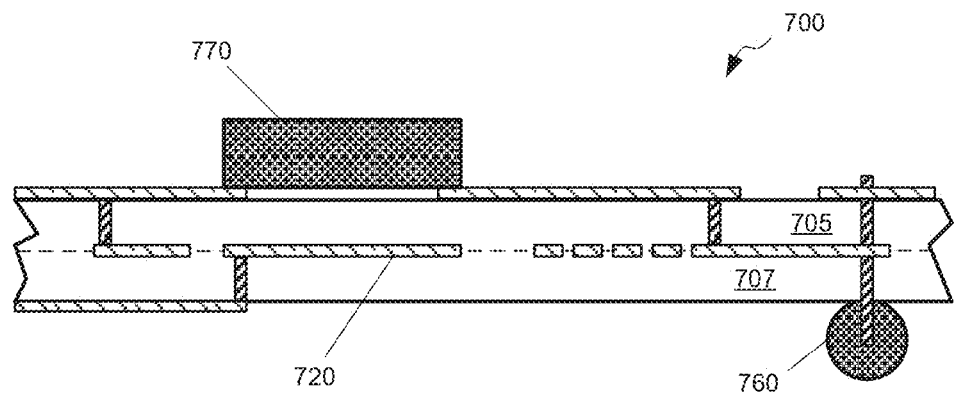
FIG. 7 depicts, in elevation view, a portion of an assembled PCB, according to one example.

In various embodiments, a printed circuit board 700 (depicted in FIG. 7) having high-speed interconnects 720 formed according to the present embodiments may be used in the manufacture of consumer electronic devices. For example, a PCB 700 may include one or more dielectric layers 705, 707 and one or more circuit elements 760, 770 that are connected to the PCB. The circuit elements may include one or more integrated chips or processors 770 as well as passive elements such as resistors 760. Additional circuit components such as capacitors, diodes, inductors, etc. may also be included with the PCB 700. In some embodiments, a PCB having one or more high-speed interconnects may be used in the manufacture of smartphones, laptops, tablet computers, portable digital assistants, and the like.

The section headings used herein are for organizational purposes only and are not to be construed as limiting the subject matter described in any way.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

As one example of a variation, pads are illustrated as annular, conducting structures, but the invention is not limited to any specific shape of a pad. An annular configuration may result from a circular conductive disc on a layer of the printed circuit board through which a hole is drilled. That hole may be plated to interconnect conducting discs and/or other conductive structures on other layers through which the hole passes. A disc is convenient when drilling a hole because the drill can be targeted for the center of the circular disc, and even if there is some misalignment in any direction, the drill will nonetheless pierce the conductive disc. A disc can have a radius that is as small as the possible misalignment, allowing a relatively small conductive disc to be used in interconnecting layers. When adding a conductive disc to a signal trace to create interconnections, for example, having the added conductive disc and resulting pad small may be desirable. However, in some embodiments, a small pad may not be necessary or desirable. For example, the "pad" may be initially square, polygonal, or oblong, through which a hole may be formed. As another example, when connecting a ground plane to a conducting structure on another layer, it may be desirable to have an expansive ground plane. Accordingly, a "pad" of a ground plane may be a conductive portion of any suitable shape adjacent a hole. In some embodiments, the "pad" may blend into conducting structures present for other reasons, such as to provide a ground plane.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. A printed circuit board comprising:
a first insulating layer and a second insulating layer;
a plurality of conductive interconnects located between the first insulating layer and adjacent to the second insulating layer of the printed circuit board, wherein the plurality of conductive interconnects extend along a planar surface of the second insulating layer; and
a first treated region on a first surface of each of the plurality of conductive interconnects that exhibits greater adhesion to the first insulating layer than a second region of the first surface when the first insulating layer is applied to the plurality of conductive interconnects, wherein each first surface is on a first side of the conductive interconnects that is opposite a second side of the conductive interconnects that contacts the planar surface of the second insulating layer, wherein the conductive interconnect supports NRZ data transmission rates between 40 Gb/s and 60 Gb/s with less than 25 dB of loss.

2. The printed circuit board of claim 1, wherein the first treated region includes a chemical adhesion promoter.

3. The printed circuit board of claim 1, wherein the first treated region includes one or more material depositions that increases adhesion to a cured form of the first insulating layer.

4. The printed circuit board of claim 1, wherein the first treated region has a first surface roughness greater than a second surface roughness of the second region.

5. The printed circuit board of claim 4, wherein each of the conductive interconnects is formed from a rolled or rolled annealed metallic foil.

6. The printed circuit board of claim 5, wherein the metallic foil comprises copper.

7. The printed circuit board of claim 4, wherein the second region extends across a trace of a conductive interconnect and the first treated region extends across a pad attached to the trace.

8. The printed circuit board of claim 7, wherein a transition between the first treated region and the second region occurs within 2 mm of a junction between the trace and the pad.

9. The printed circuit board of claim 7, wherein the pad comprises a conductive area having a width greater than a width of the trace and having a hole in the conductive area.

10. The printed circuit board of claim 4, wherein the first surface roughness is an average peak-to-peak value measured over the first treated region and the second surface roughness is an average peak-to-peak value measured over the second region.

11. The printed circuit board of claim 10, wherein the first treated region has a lateral dimension between 0.25 mm and 1.0 mm and the second region has a lateral dimension between 100 microns and 300 microns, and the first surface roughness is at least 25% greater than the second surface roughness.

12. The printed circuit board of claim 4, further comprising a conductive reference plane having a surface adjacent the second insulating layer and having a surface roughness approximately equal to the first surface roughness.

13. The printed circuit board of claim 1, wherein one or both of the first insulating layer and second insulating layer has a dielectric constant less than 3.5 and a dissipation factor less than 0.002 at applied frequencies between 2 GHz and 10 GHz.

14. The printed circuit board of claim 1, wherein one or both of the first insulating layer and second insulating layer has a dielectric constant less than 4.0 and a dissipation factor less than 0.0035 at applied frequencies between 1 GHz and 12 GHz.

15. The printed circuit board of claim 1, further comprising a digital electronic chip connected to a conductive interconnect of the plurality of conductive interconnects.

16. The printed circuit board of claim 15, wherein the digital electronic chip is a component of a smart phone, a computer, a personal digital assistant, or a video recording device.

17. The printed circuit board of claim 1, further comprising fibrous reinforcing filling material within one or both of the first insulating layer and the second insulating layer.

18. The printed circuit board of claim 1, wherein one or both of the first insulating layer and second insulating layer comprises polytetrafluoroethylene, fluorinated ethylene propylene, polyimide, polyether ether ketone, epoxy, polyphenylene oxide, polyphenylene ether, cyanate ester, and hydrocarbon or a polyester.

19. The printed circuit board of claim 1, further comprising a conductive reference plane having holes formed through the conductive reference plane to increase adhesion of the conductive reference plane to the second insulating layer.

20. The printed circuit board of claim 1, wherein the conductive interconnect supports NRZ data transmission rates between 40 Gb/s and 60 Gb/s with less than 25 dB of loss over 70 cm.

21. A printed circuit board comprising:
a plurality of conductive interconnects located between a first insulating layer and a second insulating layer of the printed circuit board; and
a first treated region on a first surface of each of the plurality of conductive interconnects that exhibits greater adhesion to the first insulating layer than a second region of the first surface, wherein the first treated region has a first surface roughness greater than a second surface roughness of the second region; and
a conductive reference plane having a surface adjacent the second insulating layer and having a surface roughness approximately equal to the first surface roughness.

22. The printed circuit board of claim 21, wherein each of the conductive interconnects is formed from a rolled or rolled annealed metallic foil.

23. The printed circuit board of claim 21, wherein the second region extends across a trace of a conductive interconnect and the first treated region extends across a pad attached to the trace.

24. The printed circuit board of claim 21, wherein the first surface roughness is an average peak-to-peak value measured over the first treated region and the second surface roughness is an average peak-to-peak value measured over the second region.

25. The printed circuit board of claim 21, wherein the conductive interconnect supports NRZ data transmission rates between 40 Gb/s and 60 Gb/s with less than 25 dB of loss over 70 cm.

26. The printed circuit board of claim 21, wherein one or both of the first insulating layer and second insulating layer has a dielectric constant less than 3.5 and a dissipation factor less than 0.002 at applied frequencies between 2 GHz and 10 GHz.

27. The printed circuit board of claim 21, further comprising a digital electronic chip connected to a conductive interconnect of the plurality of conductive interconnects.

28. A printed circuit board comprising:
a plurality of conductive interconnects located between a first insulating layer and a second insulating layer of the printed circuit board; and
a first treated region on a first surface of each of the plurality of conductive interconnects that exhibits greater adhesion to the first insulating layer than a second region of the first surface, wherein one or both of the first insulating layer and second insulating layer has a dielectric constant less than 3.5 and a dissipation factor less than 0.002 at applied frequencies between 2 GHz and 10 GHz.

29. The printed circuit board of claim 28, wherein the first treated region includes a chemical adhesion promoter.

30. The printed circuit board of claim 28, wherein the first treated region includes one or more material depositions that increases adhesion to a cured form of the first insulating layer.

31. The printed circuit board of claim 28, wherein the first treated region has a first surface roughness greater than a second surface roughness of the second region.

32. The printed circuit board of claim 31, wherein the second region extends across a trace of a conductive interconnect and the first treated region extends across a pad attached to the trace.

33. The printed circuit board of claim 28, wherein the first surface roughness is an average peak-to-peak value measured over the first treated region and the second surface roughness is an average peak-to-peak value measured over the second region.

34. The printed circuit board of claim 28, wherein the conductive interconnect supports NRZ data transmission rates between 40 Gb/s and 60 Gb/s with less than 25 dB of loss over 70 cm.

35. The printed circuit board of claim 28, further comprising a digital electronic chip connected to a conductive interconnect of the plurality of conductive interconnects.

36. The printed circuit board of claim 28, further comprising fibrous reinforcing filling material within one or both of the first insulating layer and the second insulating layer.

37. The printed circuit board of claim 28, wherein each of the conductive interconnects is formed from a rolled or rolled annealed metallic foil.

* * * * *